US009426886B2

(12) United States Patent
Van Dorn et al.

(10) Patent No.: US 9,426,886 B2
(45) Date of Patent: Aug. 23, 2016

(54) ELECTRICAL CONNECTION WITH REDUCED TOPOGRAPHY (71) Applicant: Seagate Technology LLC, Cupertino, CA (US)

(72) Inventors: Carolyn Pitcher Van Dorn, Crystal, MN (US); Lily Horng Youtt, Eagan, MN (US); Daniel Boyd Sullivan, Carver, MN (US)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 415 days.

(21) Appl. No.: 13/753,730

(22) Filed: Jan. 30, 2013

(65) Prior Publication Data
US 2014/0209368 A1    Jul. 31, 2014

(51) Int. Cl.
G11B 5/127    (2006.01)
H05K 1/11     (2006.01)
G11B 5/10     (2006.01)
G11B 5/31     (2006.01)
G11B 5/60     (2006.01)
H05K 1/02     (2006.01)
H05K 1/05     (2006.01)

(52) U.S. Cl.
CPC ............ *H05K 1/115* (2013.01); *G11B 5/102* (2013.01); *G11B 5/3173* (2013.01); *G11B 5/6094* (2013.01); *H05K 1/0219* (2013.01); *H05K 1/0259* (2013.01); *H05K 1/053* (2013.01); *Y10T 29/49124* (2015.01)

(58) Field of Classification Search
CPC ... G11B 5/102; G11B 5/3173; G11B 5/6094; H05K 1/115; H05K 1/0219; H05K 1/0259; H05K 1/053

USPC ......................................................... 174/262
See application file for complete search history.

(56) References Cited

U.S. PATENT DOCUMENTS

| 5,682,190 A | 10/1997 | Hirosawa et al. |
| 7,805,826 B1 | 10/2010 | Spillane |
| 8,647,977 B2 * | 2/2014 | Yang ............... H01L 21/76885 257/774 |
| 2002/0115002 A1 | 8/2002 | Bailey et al. |
| 2004/0189994 A1 | 9/2004 | Sreenivasan et al. |
| 2006/0032437 A1 | 2/2006 | McMackin et al. |

(Continued)

OTHER PUBLICATIONS

Scheer, Hella-Christin Pattern Defintion by Nanoimprint; Proc. SPIE vol. 8428, Micro-Optics 2012, 842802 (Jun. 1, 2012), pp. 1-15.

(Continued)

*Primary Examiner* — Timothy Thompson
*Assistant Examiner* — Paul McGee, III
(74) *Attorney, Agent, or Firm* — HolzerIPLaw, PC (57) ABSTRACT The formation of substrate electrical connections on thin film heads is one source of resulting surface topography. In accordance with one implementation, such topography can be reduced by a process that includes depositing a first layer of basecoat, creating electrical recessed vias in one or more plating processes, and depositing a second layer of basecoat on top of the electrical vias and on top of the first layer of basecoat. In one implementation, the first and second layers of basecoat have a combined height that is substantially equal to the height of the electrical recessed vias. In one implementation, the resulting topographical features are small enough that they can be planarized without creating a lack of uniformity in the total basecoat thickness across the wafer.

20 Claims, 12 Drawing Sheets

(56) References Cited

U.S. PATENT DOCUMENTS

| | | |
|---|---|---|
| 2006/0150849 A1 | 7/2006 | Van Santen et al. |
| 2006/0230959 A1 | 10/2006 | Meijer et al. |
| 2006/0290017 A1 | 12/2006 | Yanagisawa |
| 2007/0082457 A1 | 4/2007 | Chou et al. |
| 2007/0138699 A1 | 6/2007 | Wuister et al. |
| 2007/0228609 A1 | 10/2007 | Sceenivasan et al. |
| 2008/0308971 A1 | 12/2008 | Liu et al. |
| 2010/0105169 A1* | 4/2010 | Lee ............... H01L 21/76898 438/107 |
| 2011/0104322 A1 | 5/2011 | Park et al. |
| 2011/0146568 A1 | 6/2011 | Haukka et al. |
| 2012/0061732 A1 | 3/2012 | Hirai et al. |

OTHER PUBLICATIONS

Malloy, Matt and Litt, Lloyd Technology Review and Assessment of Nanoimprint Lithography for Semiconductor and Patterned Media Manufacturing; Journal of Micro/Nanolithography, MEMS, and MOEMS, Jul.-Sep. 2001/vol. 10, pp. 1-14.

* cited by examiner

ELECTRICAL CONNECTION WITH REDUCED TOPOGRAPHY

SUMMARY

Implementations described and claimed herein provide for a layered microelectronic structure comprising a basecoat layer on a substrate; an electrical via in the basecoat layer that contacts the substrate and has a base portion and an upper portion, the upper portion having an outer casing and an interior prong; and a contact pad that contacts the upper portion and is axially aligned with the base portion and the upper portion.

This Summary is provided to introduce an election of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

DETAILED DESCRIPTION

Improvements in magnetic storage media technology allow for the areal recording densities on magnetic discs that are available today. However, as areal recording densities increase, smaller and more sensitive thin film heads are desired. Fabrication of thin film heads for densities above 1 Tbpsi require the formation of complex feature geometries that may not readily and cost-effectively be created using traditional optical lithography techniques or by alternatives such as ebeam lithography. These complete feature geometries can, however, be created using NanoImprint Lithography (NIL) techniques.

NanoImprint lithography (NIL) offers advanced pattern fidelity similar to ebeam lithography, but is significantly faster and offers throughput similar to optical lithography. Unlike optical lithography patterning, NIL patterning relies on direct contact between a wafer and a template that is pressed against the wafer. This direct contact permits capillary forces to draw droplets of liquid photoresist on the wafer into patterned grooves on the template. However, when significant topography is present on the wafer prior to NIL imprinting, such capillary forces may be insufficient to draw the liquid photoresist into the cavities. In such cases, NIL imprinting can be problematic.

As used herein, the term "significant surface topography" refers to topographical features created on the surface of a wafer that are large to be problematic in a NIL imprinting process. For example, significant surface topography may refer to features large enough to prevent a NIL template from making direct and substantially uniform contact with a photoresist on the wafer during NIL patterning. Typically, such contact is prevented when two or more microns of topography are present on the surface of the wafer. However, such contact may be prevented in other implementations when there is substantially between 0.5 and 1.0 μm of topography on the wafer. Alternatively, significant surface topography may refer to features less than 0.5 microns that create other problems in NIL patterning.

One source of significant surface topography in thin film head creation is the addition of substrate electrical connections to the thin film heads. Although polishing processes can remove some surface topography, polishing is time consuming and can create wafer uniformity problems when 2.5 microns of topography or greater are present on the wafer. Additionally, polishing is not always time or cost efficient. Implementations of the methods disclosed herein significantly reduce surface topography formed incident to the creation of substrate electrical connections on a transducer head.

Figure 1:
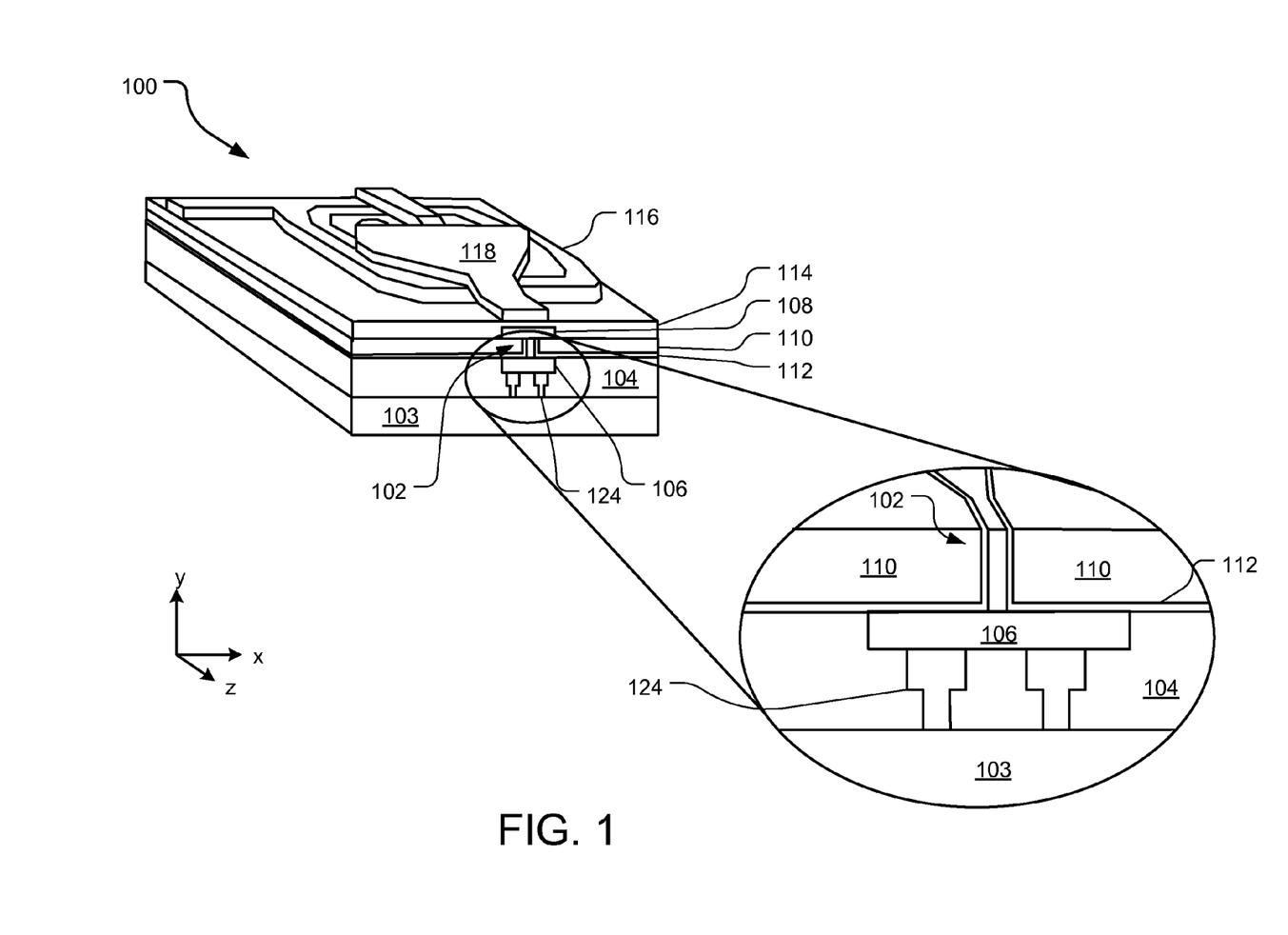
FIG. 1 illustrates an example air-bearing surface of a transducer head manufactured using NIL and/or optical lithography techniques.

FIG. 1 illustrates an example air-bearing surface of a transducer head 100 manufactured using NIL and/or optical lithography techniques. The transducer head 100 is a laminated structure with a variety of layers performing a variety of functions. A substrate 103 serves as a mounting surface for the transducer head 100 components and connects the transducer head 100 to an air-bearing slider (not shown). The substrate 103 is preferably a hard material with high thermal stability, such as aluminum-titanium carbide (AlTiC). In one implementation, the substrate 103 is a layer of AlTiC that is approximately 1210 μm thick.

A nonmagnetic, nonconductive basecoat 104 is deposited on the substrate 103. The basecoat 104 may be, for example, aluminum oxide ($Al_2O_3$), silicon oxynitride ($Si_xO_yN_z$), aluminum nitride, silicon nitride, or silicon oxide. In one implementation, the basecoat layer 104 has a height (y-direction) that is substantially between three and ten microns thick.

A read element 102 is sandwiched between a lower shield 106 and an upper shield 108. The shields 106 and 108 isolate the read element 102 from electromagnetic interference, primarily y-direction interference, and serve as electrically conductive first and second electrical leads connected to processing electronics (not shown). Further, side shields 110 isolate the read element 102 from electromagnetic interference, primarily x-direction interference and/or z-direction interference. Nonmagnetic, nonconductive isolation layers 112 electrically isolate the lower shield 106 and the read element 102 from soft magnetic or nonmagnetic side shields 110. The read element 102 is configured to read data from a magnetic media rotating below an air-bearing surface (represented by the x-y plane) of the transducer head 100. In at least one implementation, the read element 102 is created through a NIL imprinting process.

The transducer head 100 also includes a barrier layer 114 between a coil 116 and the shield 108. The coil 116 in combination with a write pole 118 receives a write signal from the processing electronics and changes the magnetic polarization of magnetic regions on an adjacent magnetic media (not shown), thereby writing the data from the write signal to the magnetic media.

To avoid the build-up of electro-static charge and certain electrical shock events, metal features 124 (which may also be referred to herein as "substrate electrical connections" or "electrical vias") are embedded in the basecoat 104 to connect one or more contact pads (not shown) on the lower shield 106 to the substrate 103. Forming such electrical connections 124 via one or more of the implementations disclosed herein may result in surface topography that is reduced as compared to existing methods.

The transducer head 100 is attached to an air-bearing slider (not shown) at a distal end of an actuator arm flexure (not shown). The slider enables the transducer head 100 to fly in close proximity above a corresponding surface of the adjacent magnetic media. The air-bearing surface of the transducer head 100 faces the magnetic media. The actuator arm flexure attached to a cantilevered actuator arm (not shown) and the actuator arm flexure is adjustable to follow one or more tracks of magnetic data on a magnetic media (not shown). Electrical wires (not shown) extend along the actuator arm flexure and attach to contact pads (not shown) on the slider that ultimately connect to the transducer head 100. Read/write and other electrical signals pass to and from processing electronics (not shown) to the transducer head 100 via the electrical wires and contact pads.

Typically, multiple transducer heads that are the same or similar to the transducer head 100 are formed on a semiconductor wafer at a factory and then separated by a dicing process. Therefore, multiple transducer heads may be formed simultaneously via the processes disclosed herein. One or multiple substrate electrical connections may be included in a single transducer head.

The steps discussed below with respect to FIGS. 2-11 describe implementations of one or more methods for building substrate electrical connections in thin film transducer heads. Each of FIGS. 2-11 shows a cross-section of a transducer head taken across the x-y plane of FIG. 1.

Figure 2:
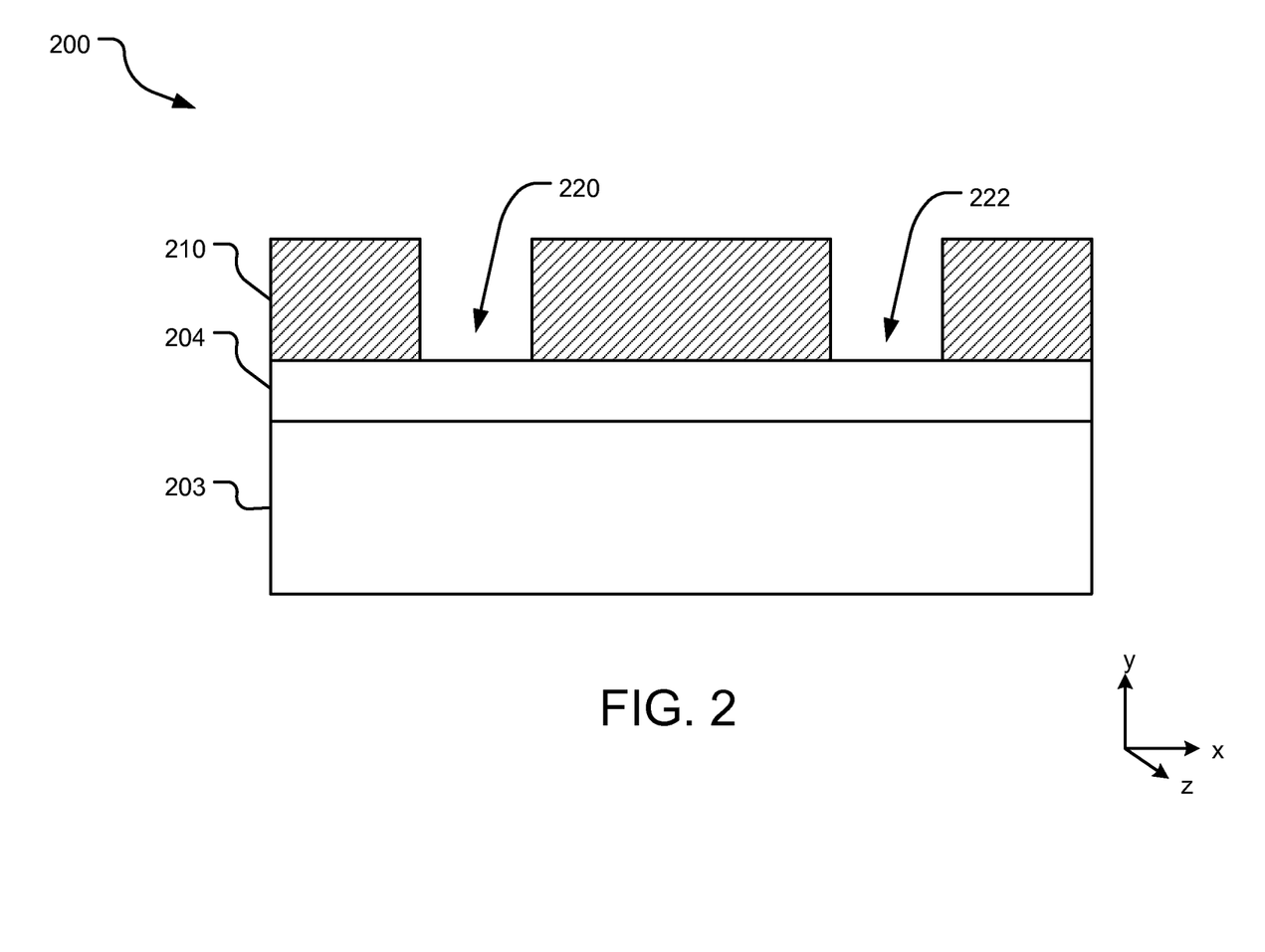
FIG. 2 illustrates a first example photoresist exposure and development step in creating substrate electrical connections in a transducer head.

FIG. 2 illustrates a first example photoresist exposure and development step in creating substrate electrical connections in a transducer head 200. A patterned photoresist 210 having recesses 220 and 222 formed therein is shown on top of a first basecoat layer 204. The first basecoat layer 204 is above and in contact with a substrate 203, which serves as a mounting surface for the transducer head 200.

The first basecoat layer 204 is a nonmagnetic, nonconductive material such as $Al_2O_3$ that is deposited on the substrate 203. The first basecoat layer 204 has a height (y-direction) that is less than a desired final basecoat height for the transducer head 200. In one implementation, the height of the first basecoat layer 204 deposited on the substrate 203 is between forty and eighty percent of a final basecoat thickness that is to be deposited on the transducer head. In another implementation, the height of the first basecoat layer 204 deposited on the substrate 203 is between forty and eighty percent of a final basecoat thickness prior to a planarization process.

The substrate 203 is a hard, thermally stable material such as AlTiC, which may be of considerably greater height than the first basecoat layer 204. In one implementation, the substrate layer has a height of approximately 1210 μm, and the first basecoat layer 204 has a height that is approximately three microns.

The patterned photoresist 210 may be either a negative or positive photoresist and has two recesses (e.g., the recesses 220 and 222) formed therein. In one implementation, the y-direction height of the patterned photoresist 210 is between approximately two and eight microns.

To create the patterned photoresist 210, a liquid photoresist layer is deposited substantially evenly across the transducer head 200. A photomask (not shown) having a pattern corresponding to the recesses 220, 222 in the patterned photoresist 210 is positioned to mask portions of the liquid photoresist layer while the unmasked portions are exposed to a high intensity light. This exposure process changes the solubility of either exposed or unexposed portions of the photoresist layer, depending upon the type of photoresist utilized. After the exposure, portions of the photoresist are removed, such as by a developer solution. In one implementation, the developer solution is an organic highly basic solution.

Figure 3:
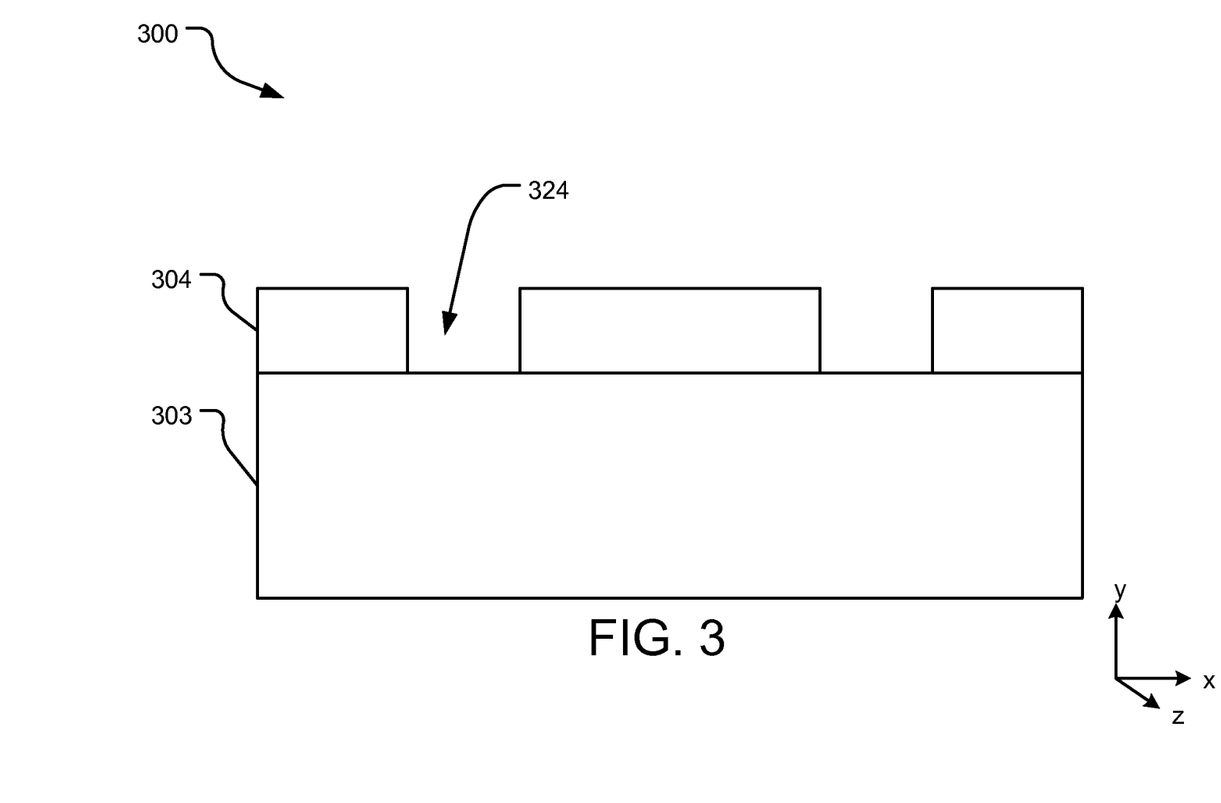
FIG. 3 illustrates an example substrate-etching step in creating substrate electrical connections in a transducer head according.

FIG. 3 illustrates an example substrate-etching step in creating substrate electrical connections in a transducer head 300. During the substrate-etching step, holes (e.g., a hole 324) are etched into a basecoat 304 to expose portions of a substrate 303. The etching step may be either a wet or dry etch and may be performed while a patterned photoresist (such as the patterned photoresist 210 in FIG. 2) is in place on the basecoat 304, protecting portions of the transducer head that will not be etched.

After the etching, the patterned photoresist may be removed. In one implementation, the patterned photoresist is removed by a resist-strip that chemically alters the patterned photoresist so that it no longer adheres to the substrate. Alternatively, the photoresist may be removed by an ashing process.

Figure 4:
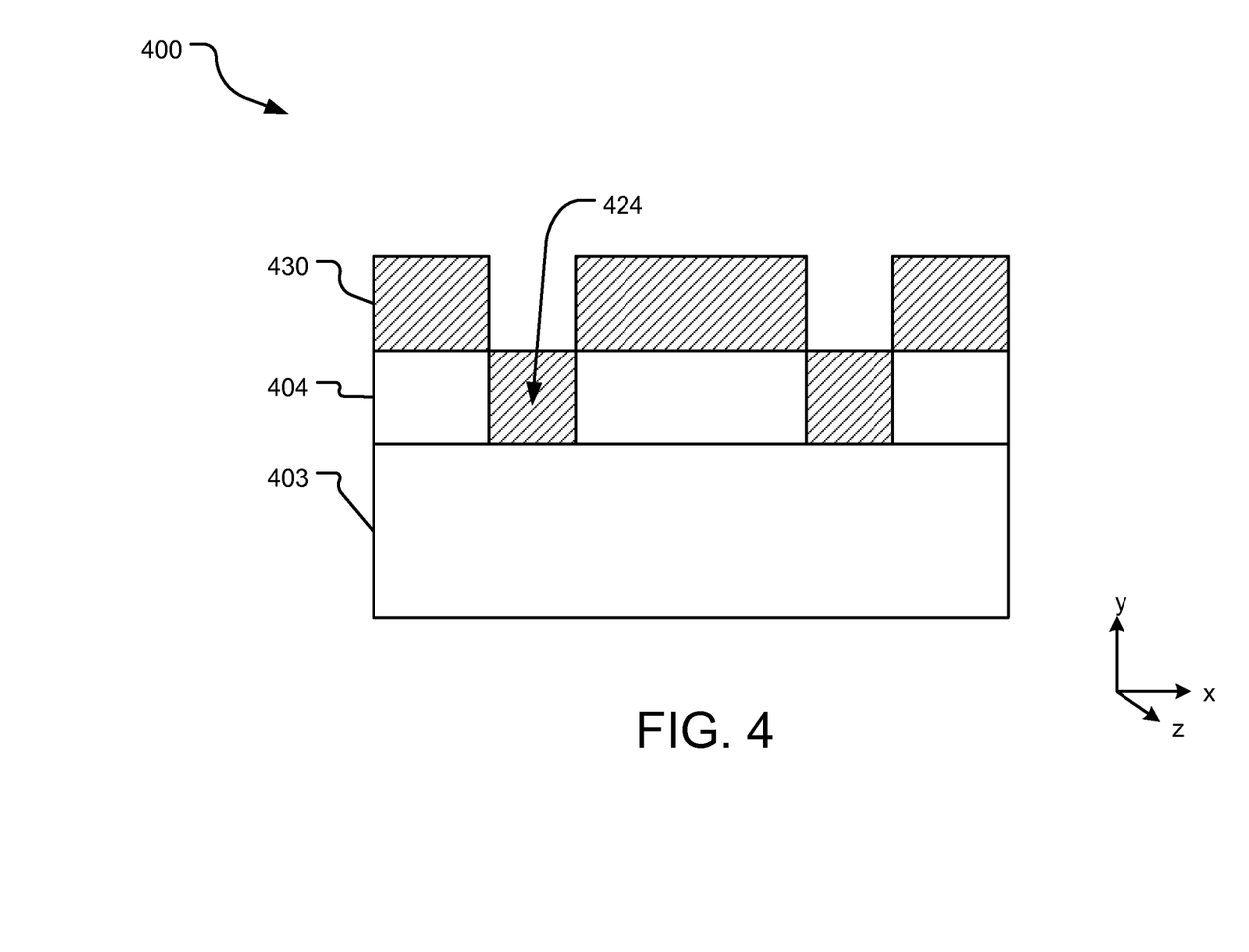
FIG. 4 illustrates a photoresist deposition step in creating substrate electrical connections in a transducer head according to another implementation.

FIG. 4 illustrates an example photoresist deposition step in creating substrate electrical connections in a transducer head 400. The transducer head 400 has a basecoat 404 with holes (e.g., a hole 424) etched therein to expose an underlying substrate 403. A layer of a liquid photoresist 430 is deposited substantially evenly across the transducer head 400 to coat the basecoat 404 and fill the etched holes, as shown in FIG. 4.

Figure 5:
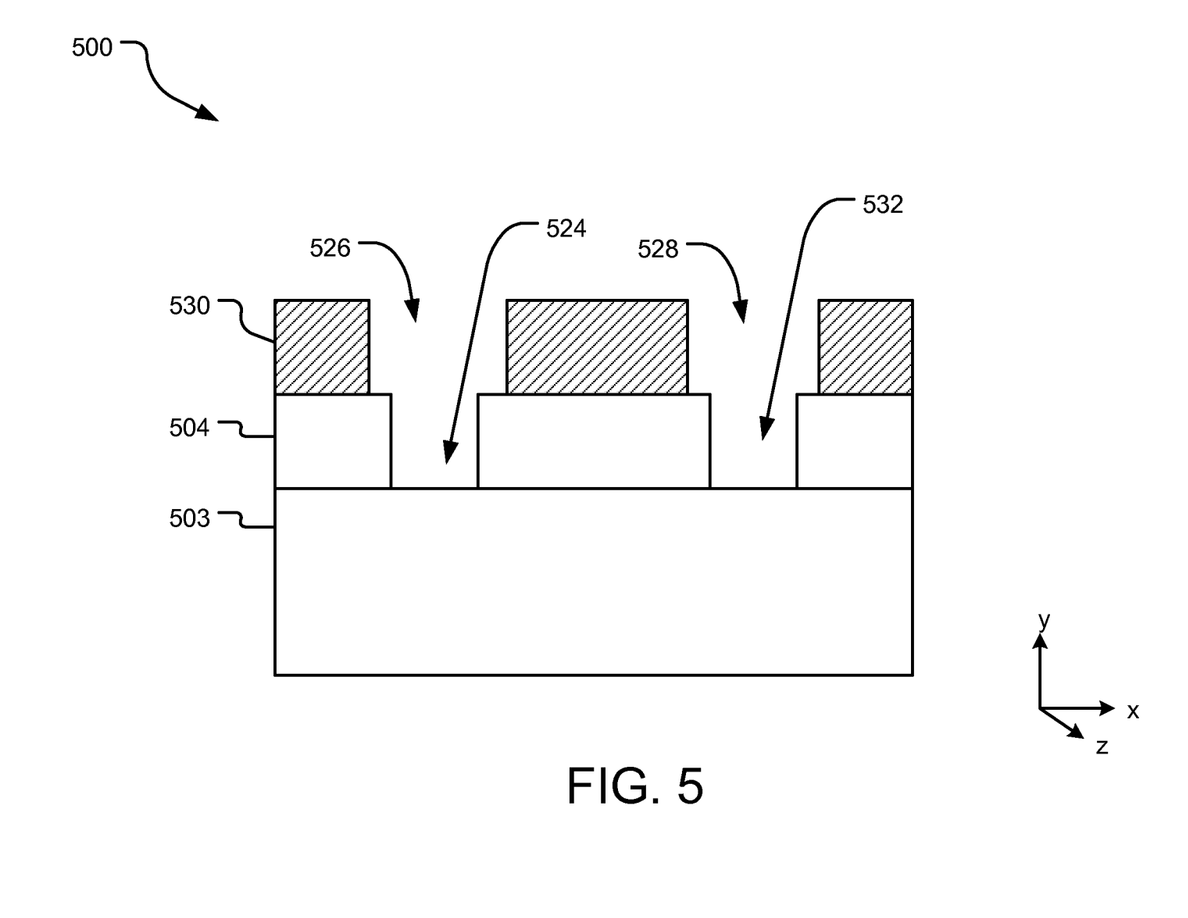
FIG. 5 illustrates another example photoresist exposure and development step in creating substrate electrical connections in a transducer head.

FIG. 5 illustrates another photoresist exposure and development step in creating substrate electrical connections in a transducer head 500. The transducer head 500 has a basecoat 504 with a number of etched holes (e.g., an etched hole 524) therein, exposing an underlying substrate 503. A patterned photoresist 530 is on top of and in contact with the basecoat 504.

The patterned photoresist 530 is created by depositing a liquid photoresist layer evenly across the transducer head 500. A photomask (not shown) having a pattern corresponding to the recesses 526, 528 in the patterned photoresist 530 is positioned to mask portions of the liquid photoresist layer.

The masked photoresist layer is then exposed to a high intensity light to change the solubility of portions of the photoresist. The exposed portions of the photoresist are developed in an aqueous solution, leaving behind the patterned photoresist 530 with two recesses (e.g., the 526 and 528) therein.

The recesses 526 and 528 in the patterned photoresist 530 are each vertically aligned with an etched hole (e.g., holes 524 and 532, respectively) in the basecoat 504, such that each of the recesses 526 and 528 in the photoresist layer shares a common base with one of the etched holes 524 and 532 in the basecoat 504. However, each of the recesses 526, 528 in the photoresist layer is wider than the width of the corresponding etched hole 524 and 532, respectively, in the basecoat 504. Therefore, metal may be plated into each of the etched holes 524 and 532 and expanded beyond the width of the respective etched holes 524 and 532. Plating metal in this manner prevents voids from forming between the basecoat 504 and the metal (not shown) during the plating process.

Figure 6:
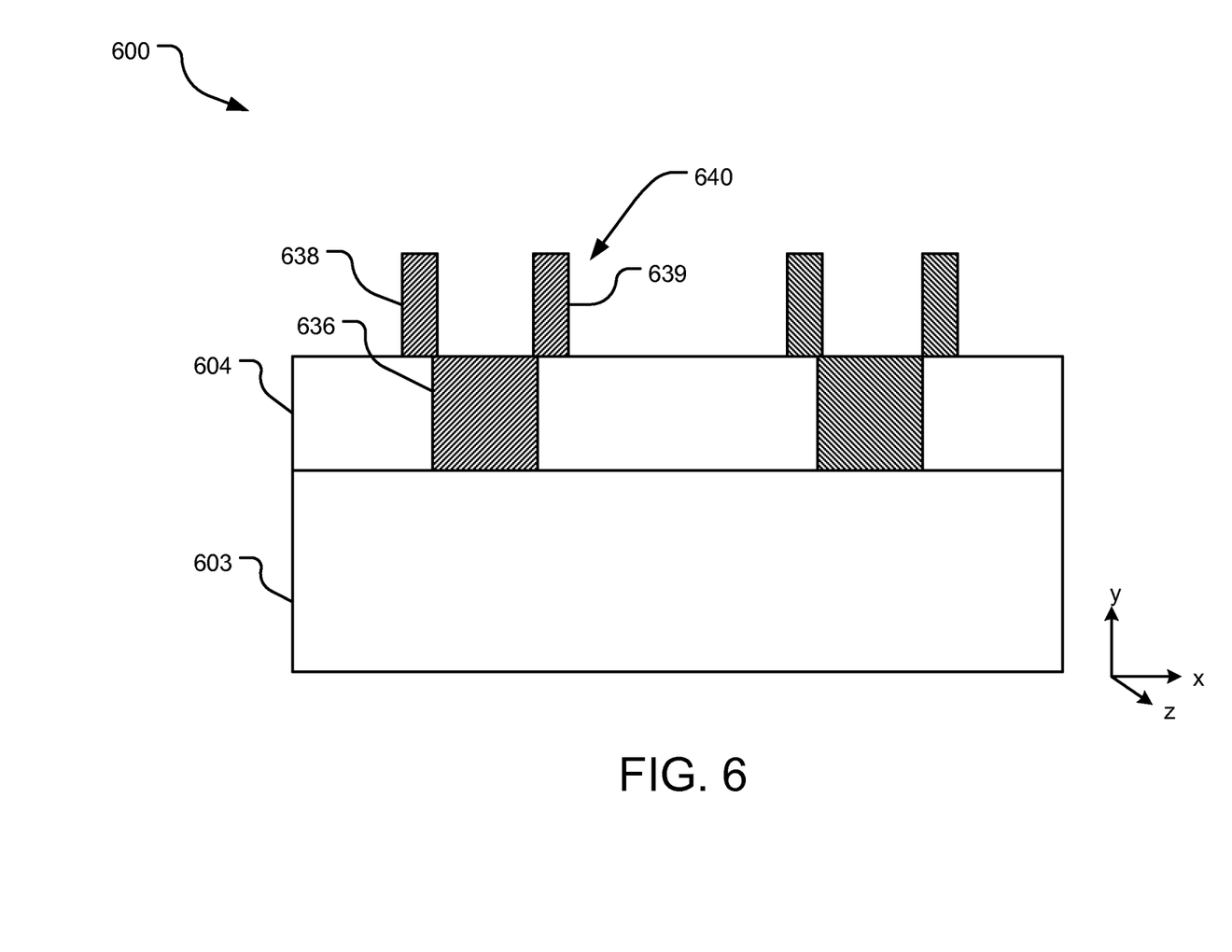
FIG. 6 illustrates an example electroplating step in creating substrate electrical connections in a transducer head.

FIG. 6 illustrates an example electroplating step in creating substrate electrical connections in a transducer head 600. Prior to the electroplating step, a patterned photoresist (such as the patterned resist 530 illustrated atop the basecoat 504 in FIG. 5) is formed on top of a basecoat 604 to protect portions of the transducer head 600 while metal (e.g., a metal connection 640) is plated into a number of etched holes in the basecoat 604 during the electroplating step.

In one implementation, a seed layer (not shown) is deposited on the transducer head 600 prior to the electroplating step to help the metal adhere to a substrate 603 and a basecoat 604. In one implementation, this seed layer is approximately 0.2 μm thick.

After the metal is plated into the etched holes in the basecoat 604, the patterned photoresist is removed, leaving behind metal connections (e.g., a metal connection 640) that are in contact with the substrate 603 and partially or fully embedded in the basecoat 604. As viewed in the x-y cross-section of FIG. 6, each of the metal connections has a base portion (e.g., a base portion 636) and two protruding shoulders (e.g., shoulders 638 and 639) on either side of the base portion. This structure, including the base portion and the shoulders is referred to hereinafter as an "electrical recessed via."

In at least one implementation, the shoulders 638 and 639 of the electrical recessed via are connected along the x-z plane. For instance, the shoulders 638 and 639 of the electrical recessed via 640 may be opposing sides of a cylindrical shell (i.e., a casing) that arcs into the x-z plane and extends longitudinally in the y-direction. Alternatively, the shoulders 638 and 639 may be opposing sides of a rectangular shell.

In the same or an alternate implementation, the base portion 636 illustrated in FIG. 6 a cylindrical, rectangular, or any non-traditional shape that extends longitudinally in the y-direction and is circular, rectangular, etc. when viewed head-on in the x-z plane.

The metal used to form the electrical recessed vias is an electrically conductive metal, which may be a variety of materials including, without limitation, Cu and NiFe. The height of the base portion (e.g. the base portion 636) of each of the electrical recessed vias is substantially equal in height (y-direction) to the height of the basecoat 604. The shoulders of each of the electrical recessed vias (e.g., the shoulders 638 and 639) are also substantially equal in height to the height of the basecoat 604.

Figure 7:
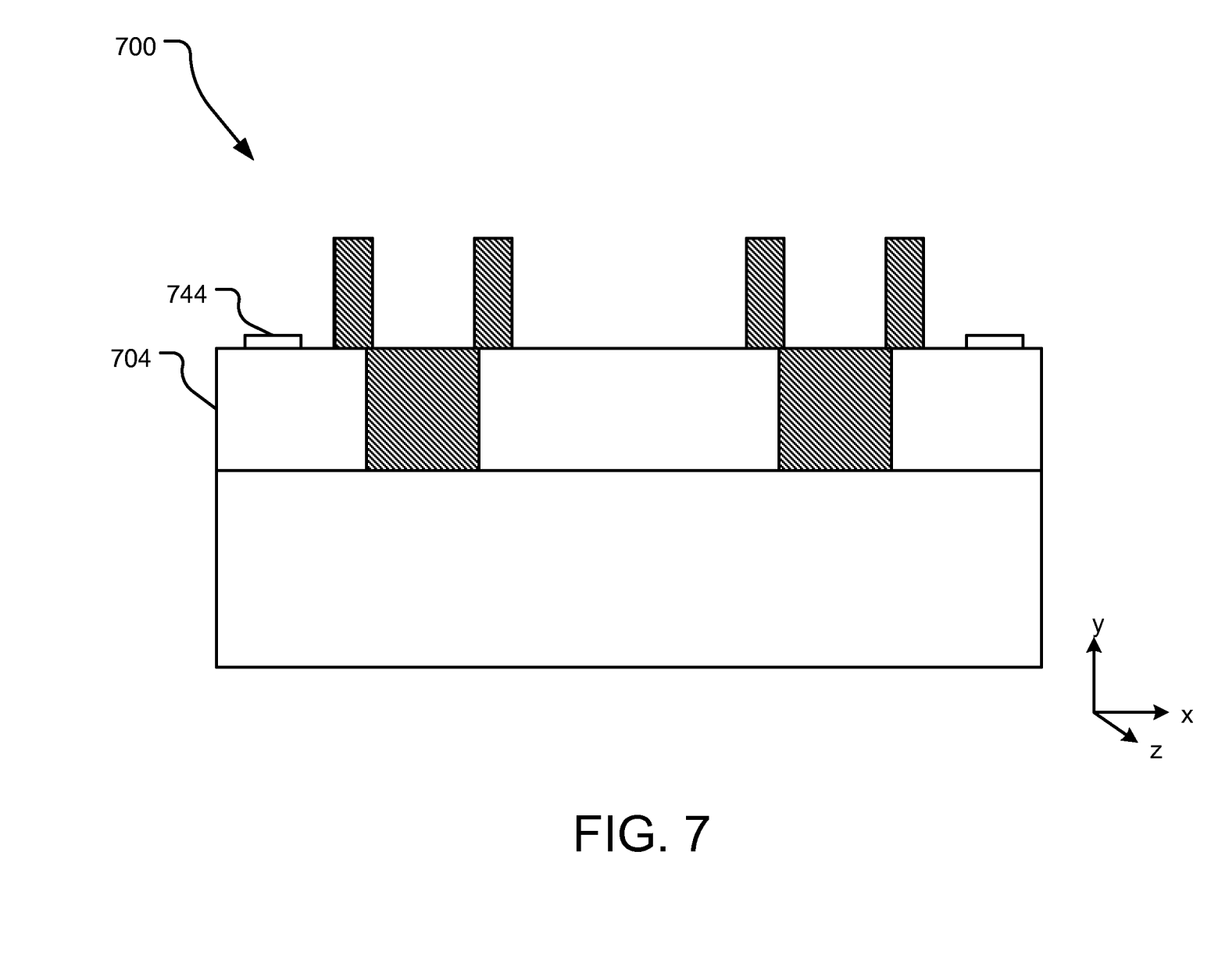
FIG. 7 illustrates an example result of a feature-building step in creating substrate electrical connections in a transducer head.

FIG. 7 illustrates an example feature-building step in creating substrate electrical connections in a transducer head 700. During the feature building step, additional features, such as heaters (e.g., a heater 744), bleed resistors (not shown), or other electrostatic discharge devices are added to a basecoat 704 of the transducer head 700.

In one implementation, a patterned photoresist (not shown) is formed on the transducer head 700 prior to the addition of such features. The patterned photoresist may be formed according to the same or similar processes as those discussed above with respect to FIGS. 2 and 5. After the additional features are added, the patterned photoresist is removed.

The additional features may be added through any number of processes including deposition and electroplating.

Figure 8:
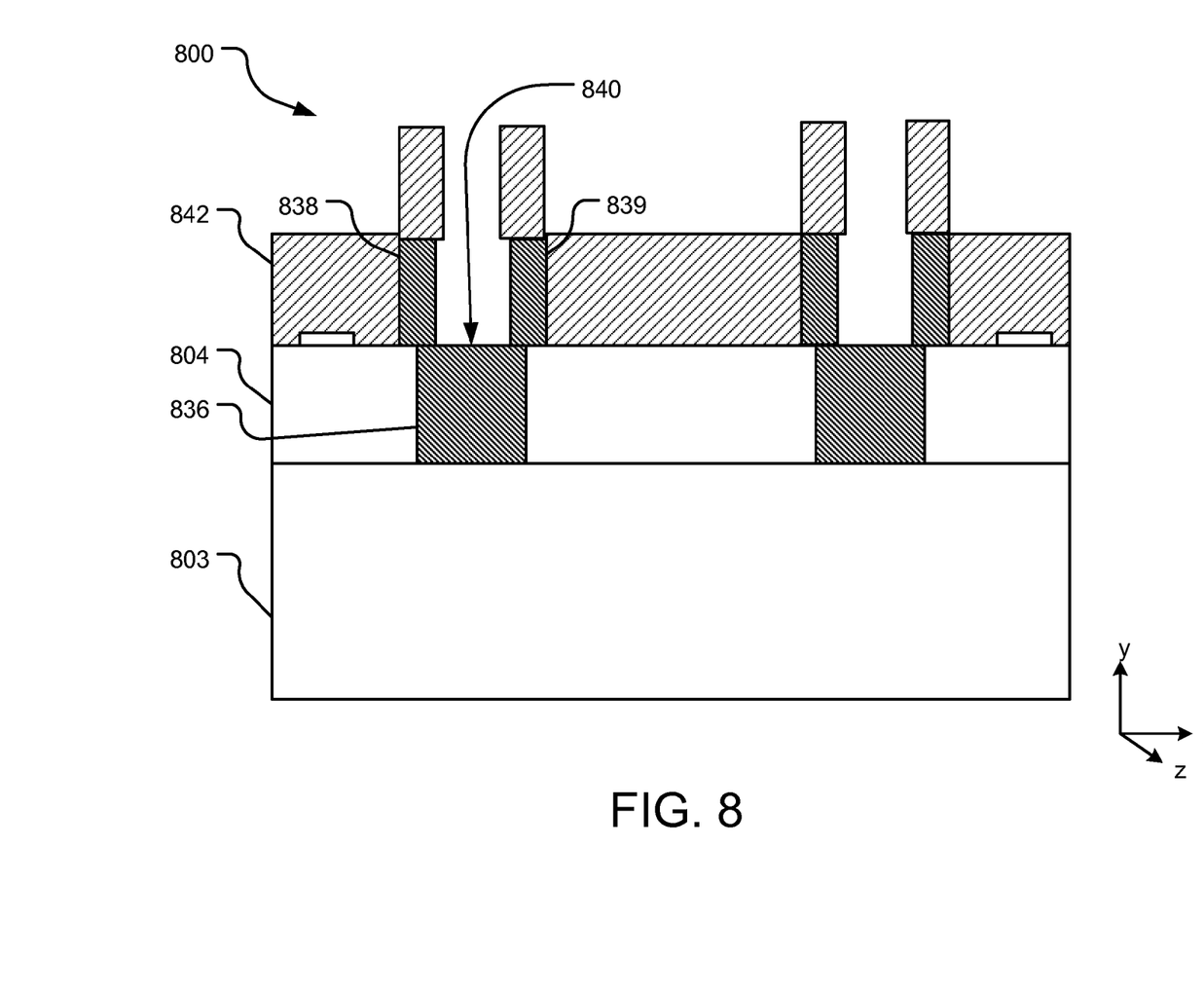
FIG. 8 illustrates yet another example photoresist exposure and development step in creating substrate electrical connections in a transducer head.

FIG. 8 illustrates another example photoresist exposure and development step in creating substrate electrical connections in a transducer head 800. An x-y cross section of the transducer head 800 is shown. The cross section includes a substrate layer 803, a basecoat 804, and a number of electrical recessed vias (e.g., an electrical recessed via 840 having a base 836 and shoulders 838 and 839) formed therein. A patterned photoresist 842 is formed on the transducer head, and is sized and configured to allow for plating of additional metal within the recess (e.g., between the shoulders 838 and 839) of each of the electrical recessed vias.

In one implementation, the patterned photoresist 842 is created by a process the same or similar to those processes described with respect to the patterned photoresists in FIGS. 2 and 5.

Figure 9:
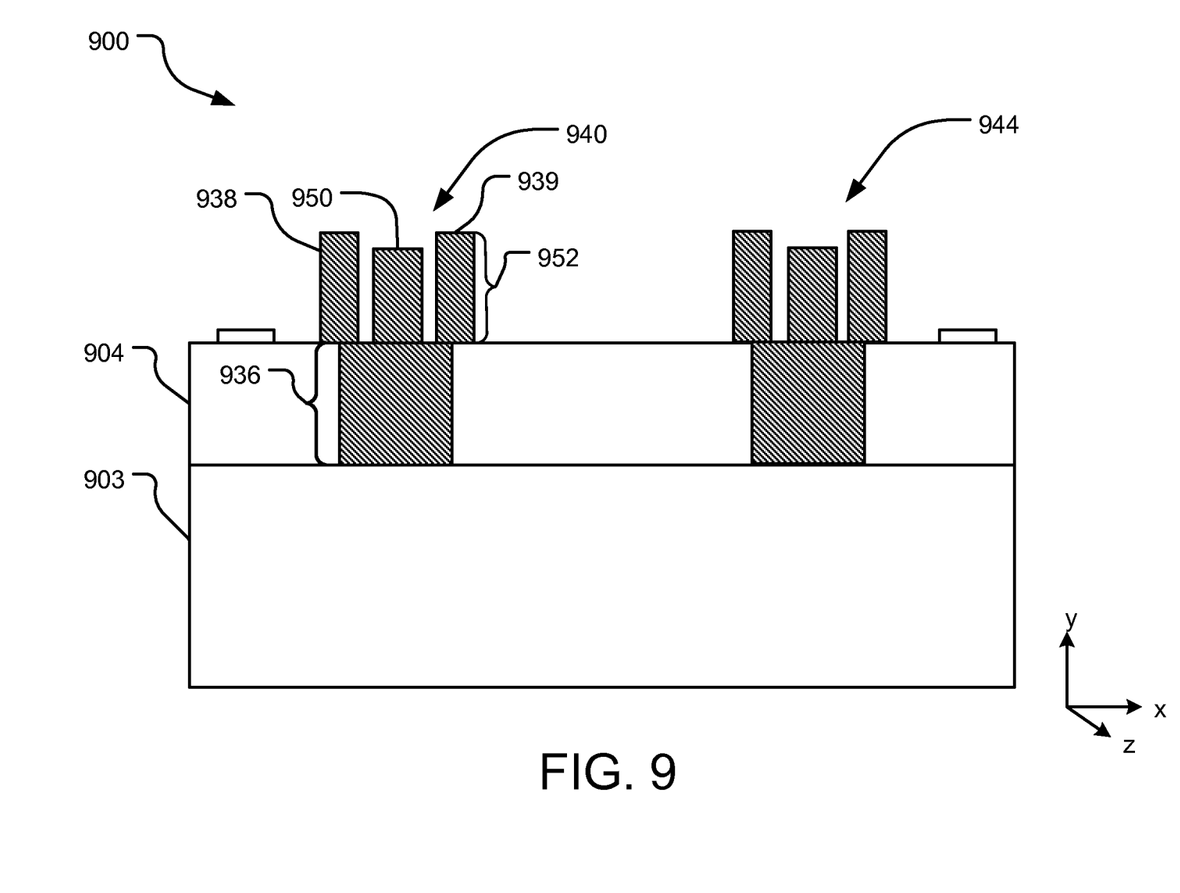
FIG. 9 illustrates yet another example electroplating step in creating substrate electrical connections in a transducer head according.

FIG. 9 illustrates a second example electroplating step in creating substrate electrical connections in a transducer head 900. During the second electroplating step, an interior metal prong (e.g., the interior metal prong 950) is plated on top of a base (e.g., a base 936) within an upper casing 952 of each of a number of electrical recessed vias formed on the transducer head 900. In one implementation, the interior metal prong is plated in the center of the upper casing. In the same or an alternate implementation, the upper casing 952 is a hollow cylindrical shell that arcs into the x-z place and extends longitudinally away from the substrate 903 (y-direction). An x-y cross section of the upper casing 952 (as illustrated in FIG. 9) includes two outer prongs or shoulders 938 and 939 on top of and on opposite sides of the base portion 936. The interior prong 950 is plated on top of the base and within the upper casing (i.e., between the shoulders 938 and 939).

The metal used to form the interior metal prongs of the electrical vias is electrically conductive and may be of the same or a different material from that utilized to form the base and the upper casing of each of the electrical vias. A patterned photoresist (such as the patterned photoresist 842 illustrated in FIG. 8) may be in place during the electroplating, and removed after such plating is complete.

The interior prong 950 has an x-direction cross-section that is less than an inner x-direction cross-section or diameter of the upper casing 952 (i.e., the spacing between the shoulders 938 and 939) so that the interior prong 950 does not contact an inner surface of the upper casing 952. In one implementation, the y-direction height of the interior prong 950 is less than or substantially equal to the height of the upper casing 952. In another implementation, the height of the interior prong 950 is greater than the upper casing 952.

Figure 10:
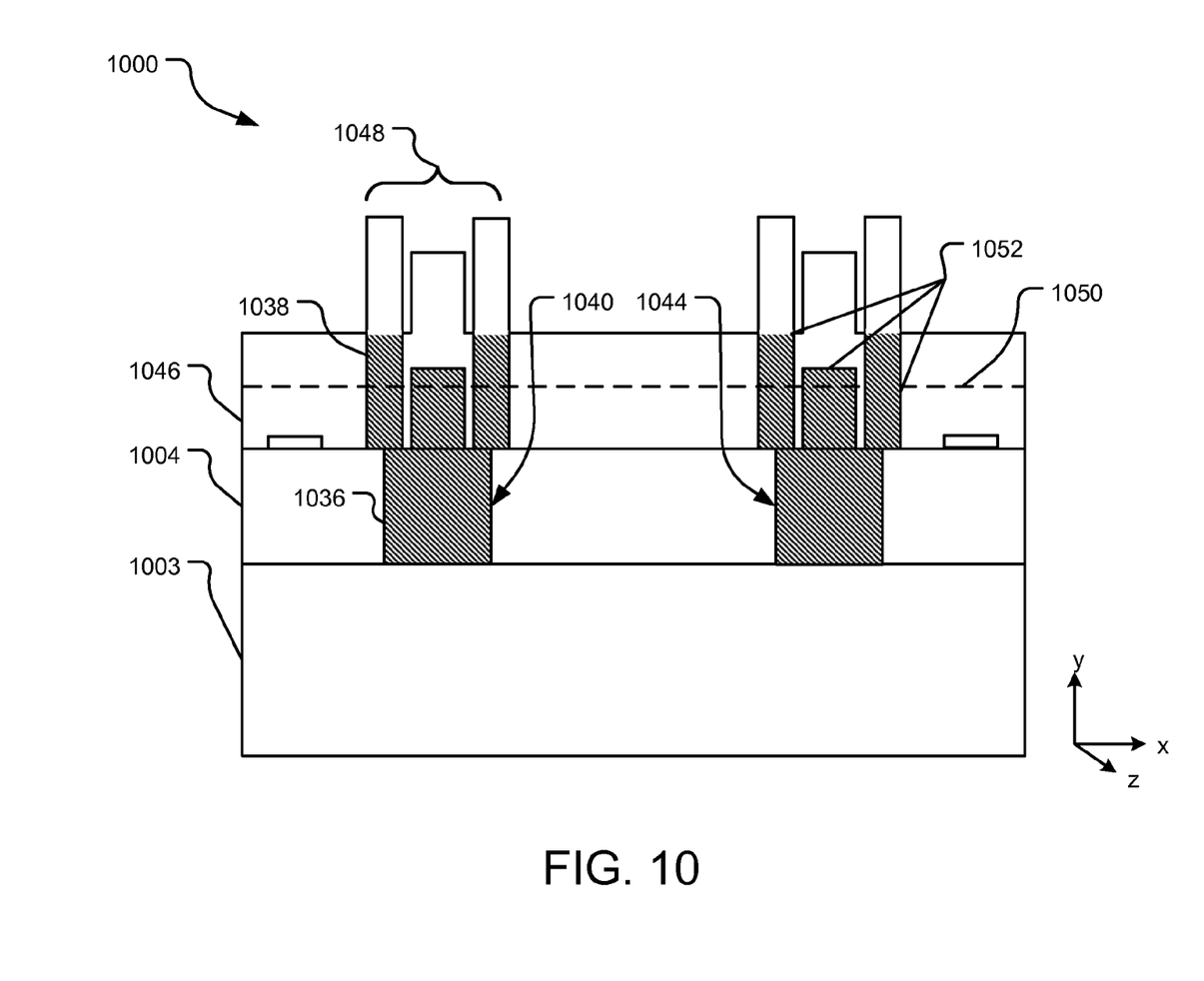
FIG. 10 illustrates an example additional basecoat layer application step in creating substrate electrical connections in a transducer head.

FIG. 10 illustrates an example additional basecoat layer application step in creating substrate electrical connections in a transducer head 1000. A cross section of the transducer head 1000, taken across the x-y plane, has a first layer of basecoat 1004 and a number of electrical vias (e.g., electrical vias 1040 and 1044) therein that are in contact with a substrate 1003 below the first basecoat layer 1004. Each of the electrical vias has a lower, base portion (e.g., base portion 1036) and an upper, three-pronged portion (e.g., a three pronged portion 1052) in contact with the base portion and extending away from the base portion.

In the additional basecoat layer application step, a second layer of basecoat 1046 is deposited in a substantially even manner across the transducer head 1000, creating a number of "humped" topographical features (e.g., the topographical features 1048) on the surface of the transducer head 1000. In one implementation, the combined height of the first 1004 and second 1046 layers of basecoat is substantially equal to a total height of the electrical vias. For example, the combined height (y-direction) of the first 1004 and second 1046 layers of basecoat may be substantially equal to the distance between the bottom of base portion 1036 to the top of the tallest prong 1038 of the electrical vias.

The topographical features created on the transducer head 1000 incident to the addition of the second layer 1046 of basecoat may extend away from the substrate 1003 in the y-direction beyond each of the electrical vias by a height that is substantially equal to the second layer 1046 of basecoat. In other implementations, the second layer of basecoat 1046 may have a height that is shorter or greater than any or all the prongs of the electrical vias.

The first 1004 and second 1046 layers of the basecoat are deposited separately, with one or more metal plating processes performed in between to form the electrical vias. In one implementation, the layer of basecoat 1004 has a thickness that is 40 to 80 percent of the combined thickness of both the first 1004 and second 1046 layers of basecoat either before or after planarization of the transducer head. As a result, the topographical features created incident to the deposition and plating processes are reduced in height as compared to the height of topographical features that may result when the basecoat is applied in a single step. Specifically, such topographical features may be reduced by 40 to 80%.

Moreover, the topographical features (e.g., the topographical features 1048) are small enough that the transducer head 1000 can be planarized, such as along the dotted line 1050, without creating a significant variability in a total basecoat height (e.g., the y-direction height of the combined first 1004 and second 1046 layers of basecoat). The planarization may be performed, for example, by a milling or lapping process.

After the planarization of the transducer head 1000, each of the electrical vias 1040 and 1044 may be exposed to allow for contact with one or more contact pads on a lower shield (not shown) of the transducer head 1000.

Figure 11:
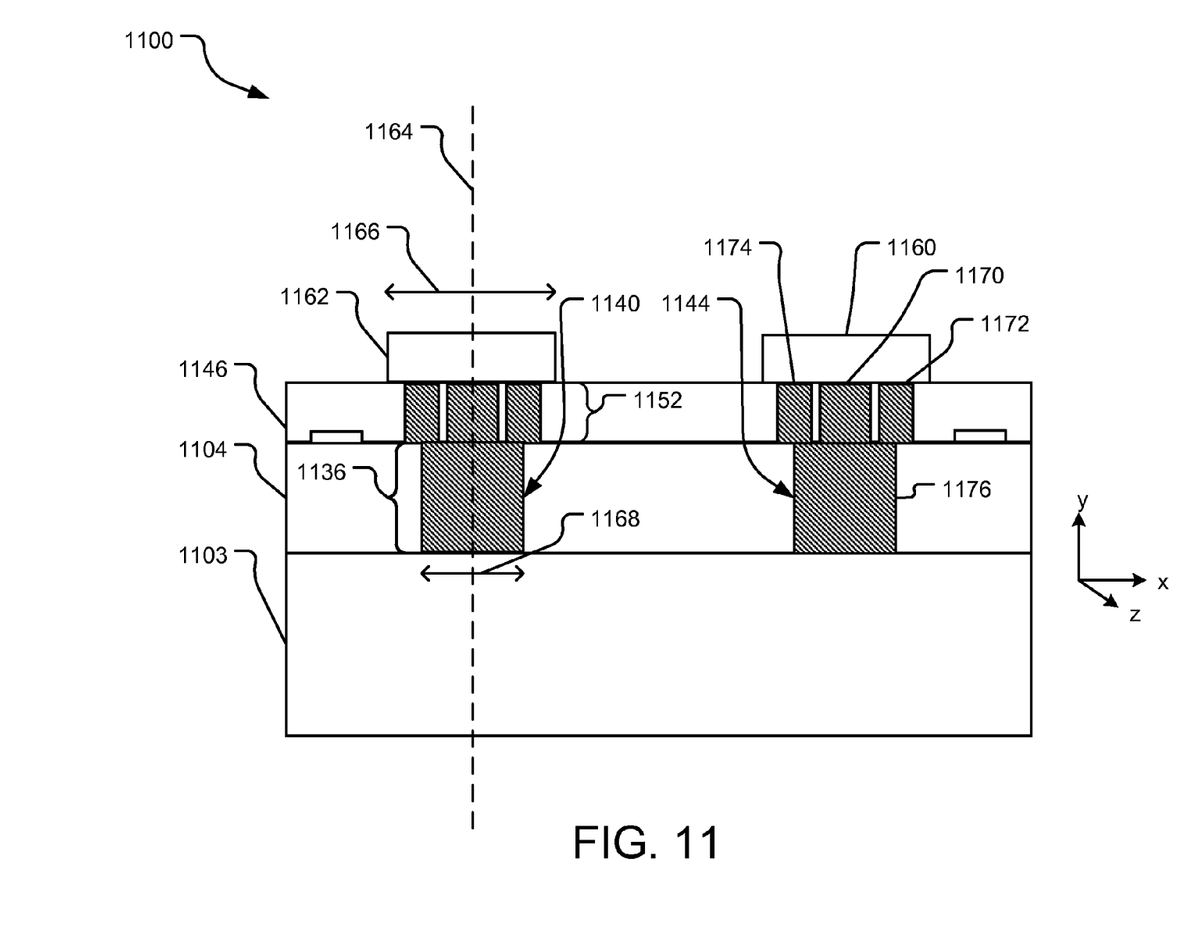
FIG. 11 illustrates an example contact pad connection step in creating substrate electrical connections in a transducer head.

FIG. 11 illustrates an example contact pad connection step in creating substrate electrical connections in a transducer head 1100. A cross section of the transducer head 1100, taken across the x-y plane, has a first layer of basecoat 1104, a second layer of basecoat 1146, and a number of electrical vias (e.g., electrical vias 1140 and 1144) therein that are in contact with a substrate 1103 below the first basecoat layer 1104. Each of the electrical vias has a base portion (e.g., base portion 1136) and an upper portion (e.g., an upper portion 1152).

The upper portion 1152 includes an outer casing or shell (illustrated by outer prongs 1172 and 1174 in the cross-sectional view of FIG. 6) that may be a cylindrical, rectangular, or non-traditional shape. In one implementation, the upper portion 1152 is a cylindrical shell that arcs into the x-z place and extends longitudinally away from the substrate 1103 (y-direction). The upper portion 1152 also includes an interior prong (e.g., an interior prong 1170) within the outer casing. Both the outer casing (illustrated by opposing sides 1172 and 1174 of the outer casing) and the interior prong 1170 are in contact with the base portion 1176. The interior prong 1170 may be round, oval, rectangular, or any other non-traditional shape when viewed head-on in the x-z plane. In the same or an alternate implementation, the base portion 1136 of the electrical via is circular, rectangular, or any non-traditional shape when viewed head-on in the x-z plane.

The upper portion 1152 is axially aligned with the base portion 1136 along an axis 1164. As used herein, the term "axially aligned" refers to an alignment perpendicular to the substrate layer 1103 (e.g., a y-direction alignment) along an axis 1164 between two or more structures that each physically intersect the axis 1164. In one implementation, the axis 1164 intersects a center of the base portion 1136.

A contact pad (e.g., a contact pad 1160) is arranged on top of each of the electrical vias such that it is axially aligned with the upper portion (e.g., an upper portion 1152) and the base portion (e.g., the base portion 1136) along the axis 1164 of the electrical via. In one implementation, the contact pad 1160 and the interior prong 1170 are axially aligned with a center of the base portion 1136.

In the implementation illustrated by FIG. 11, the upper portion 1152 of the electrical via 1140 has a width (e.g., an x-direction edge-to-edge cross section 1166) that is greater than a width (e.g., an x-direction edge-to-edge cross section 1168) of the base portion 1136.

The contact pad 1160 is in contact with both the interior prong 1170 and the outer casing (illustrated by opposing sides 1172 and 1174 of the outer casing) of the upper portion of the electrical via 1140. In one implementation, electricity may readily flow through each of the contact pads 1160, 1162 through the corresponding electrical vias 1140 and 1144.

In one implementation, the contact pad 1162 is formed by depositing a seed layer (not shown) on the transducer head 1100 to help the contact pad 1162 adhere to the transducer head 1100. A patterned photoresist (not shown) is created on the transducer head 1100 with a recess patterned therein to receive the contact pad 1162. Metal material is then electroplated into the recess to form the contact pad 1162 and the patterned resist is removed. The surface of the transducer head 1100 may thereafter be dry-etched to remove the seed layer and a top portion of the contact pad.

Figure 12:
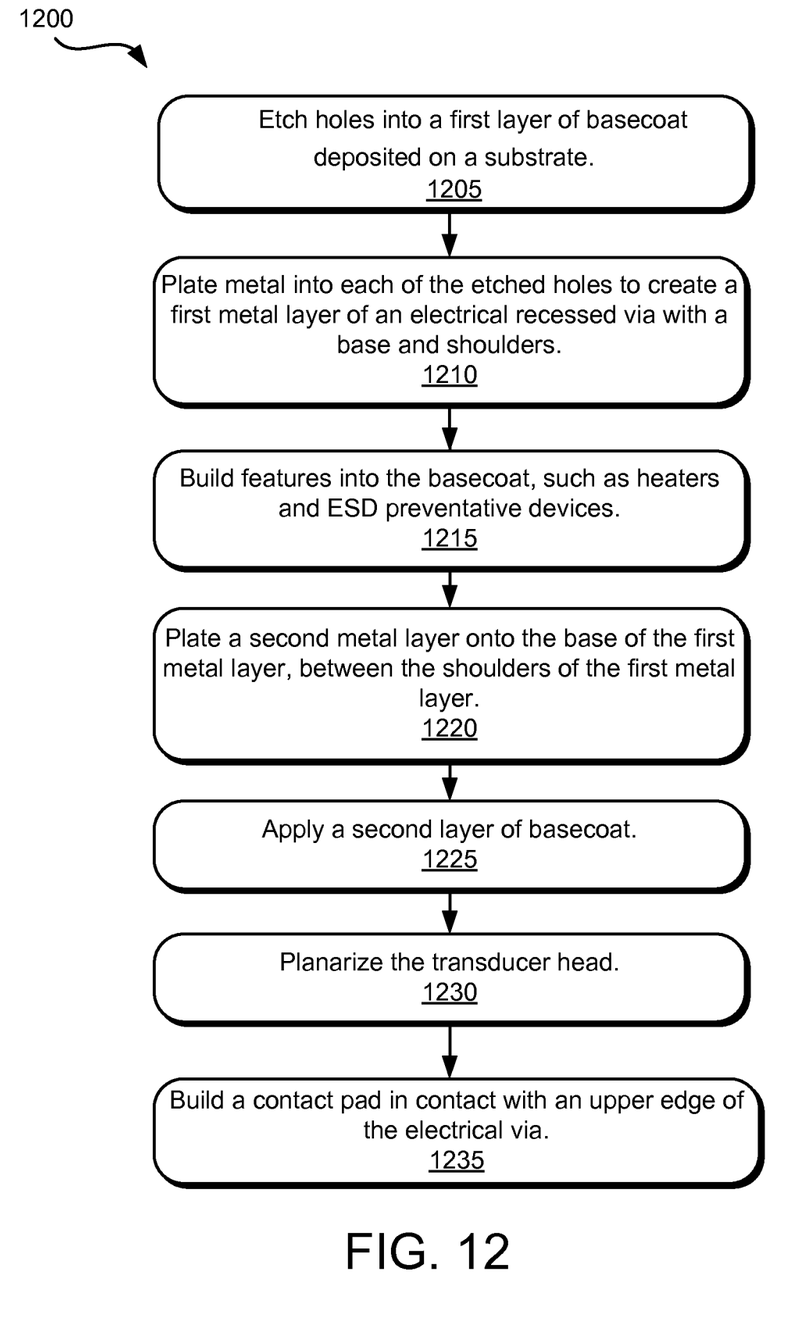
FIG. 12 illustrates a flow-chart of example operations for creating substrate electrical connections of a transducer head that result in a reduced wafer topography.

FIG. 12 illustrates a flow-chart of example operations for creating substrate electrical connections of a transducer head that result in a reduced surface topography. A basecoat etching operation 1205 etches holes in a first layer of a basecoat on a substrate. The first layer basecoat may be a nonmagnetic, non-conductive material such as $Al_2O_3$, and the substrate wafer is preferably a hard, thermally stable material such as AlTiC. In one implementation, the first layer of the basecoat has a thickness that is 40 to 80 percent of a desired final basecoat thickness. In the same or a different implementation, the final desired basecoat thickness is between 3 and 7 microns.

Several precursor steps may be employed to etch the holes in the first layer of the basecoat. First, recesses are patterned into a photoresist layer deposited on the substrate. A layer of liquid photoresist, which may be a negative or positive photoresist, is deposited across the top of the basecoat and a patterned photomask is positioned to mask the photoresist. While masked, the layer of liquid photoresist is exposed to a high intensity light to change the solubility of either the exposed or the unexposed portions of the liquid photoresist, depending on the type of photoresist utilized. The modified portions of the resist are thereafter removed by a developer solution, which may be, for example, an organic highly basic solution. In an implementation where a positive resist is used, the exposed portions of the resist have their solubility modified during the exposure. Here, the developer solution is applied to dissolve the exposed portions of the resist so that the unexposed portions remain on the wafer.

After the photoresist is patterned, holes are etched into the basecoat via an etching process, which may be either wet or dry. Thereafter, the patterned photoresist is stripped away from the basecoat, such as by using a resist strip.

The etched holes each have a depth substantially equal to the depth of the basecoat so that the underlying substrate is exposed at the base of each of the etched holes. The width of the etched holes may vary, but in one implementation, the width is substantially between 2 and 50 microns.

A building operation 1210 plates metal into each of the etched holes in the basecoat. The building operation 1210 includes several precursor steps. First, a thin seed layer is deposited across the of the transducer head. The seed layer may be any one of a number of metals having properties to help the metal adhere to the substrate and basecoat. For example, the seed layer may be Cu, NiFe, CoFe, CoNiFe, CoPt, Cr, Ru, Ta, Pt, or Au. In one implementation, the seed layer is approximately 0.2 µm thick.

After the seed layer is deposited, another photoresist layer is deposited onto the seed layer to be patterned prior to the metal plating process. Again, a photomask is positioned to mask portions of the photoresist during an exposure to high intensity light. After the exposure, portions of the resist are removed. This process creates a patterned photoresist that has a number of recesses corresponding to each of the etched holes in the basecoat. Each of the recesses in the patterned photoresist is vertically aligned with one of the etched holes in the first layer of basecoat. However, the width of each of the recesses in the photoresist may greater than the width of the corresponding etched hole to allow for metal to be plated beyond the width of each of the etched holes in the basecoat.

An electrically conductive metal, such as NiFe or Cu, is then plated into each of the etched holes in the basecoat and expanded beyond the width of the etched hole to prevent voids from forming between the first layer of basecoat and each of the metal connections. This process creates a number of electrical recessed vias, where each electrical recessed via includes a base portion nested within one of the etched holes in the basecoat and an upper casing. In one implementation, the upper casing is a hollow cylindrical shell. In another implementation, the upper casing has a diameter or width that is greater than a diameter or width of the underlying base portion. In yet another implementation, the upper casing has a longitudinal height that is substantially equal to the height of the first layer of the basecoat. After the building operation 1210, the patterned photoresist is removed.

Another feature building operation 1215 constructs ancillary features on the first basecoat layer to be embedded in the transducer head. During the building operation, another patterned photoresist may be used to protect portions of the transducer head. After the additional features are added, this layer of photoresist may be removed.

In one implementation, the feature building operation 1215 forms one or more heaters on the first basecoat layer. In operation, such heaters can be turned on to adjust a fly height of the transducer head above a rotating media disk by thermally expanding the basecoat. In the same or an alternate implementation, the feature building operation 1215 may attach one or more electrostatic discharge (ESD) devices to the basecoat, such as a bleed resistor.

Another building operation 1220 plates a second metal layer inside of the upper casing of each electrical via and above the base portion such that a metal prong is added on top of the base portion and interior to the upper casing. In one implementation, the metal prong is sized such that it does not contact an inner sidewall of the upper casing. The metal prong and upper casing may also be collectively referred to herein as the "upper portion." During the building operation 1220, portions of the transducer head may again be protected by patterned photoresist.

The metal utilized for building operation 1220 is electrically conductive and may be the same material as utilized in the metal plated by building operation 1210. However, in at least one implementation, the metal plated by building operation 1220 is a different material than that applied in building operation 1210.

In one implementation, the height of the metal prong above the base portion in each of the electrical vias is less than or equal to the height of the first layer of the basecoat. In the same or a different implementation, the height of the metal prong in each of the electrical vias is less than or equal to a height of the upper casing.

A basecoat application step 1225 applies a second layer of basecoat to the transducer head, filling the potential void between the shoulders of the first metal layer and the base of the second metal layer with the basecoat material.

A planarization step 1230 planarizes the surface of the transducer head, removing portions of the electrical vias and/or of the second layer of basecoat. Additionally, the planarization step 1230 exposes an upper edge of the upper portion on the surface of the wafer such that the upper casing and the interior prong may contact one or more contact pads on an above structure, such as a bottom shield. The planarization step 1230 may be performed by a lapping, polishing, milling or electric-chemical planarization (eCMP) operation.

In one implementation, significant surface topography is removed from the transducer head during the planarization step 1230. In the same or an alternate implementation, substantially less than two microns of topography remain on the transducer head after the planarization step 1230. In yet another implementation, a few nanometers of topography remain on the transducer head after the planarization step 1230. In any or all of these implementations, the transducer head may be suitable for NIL patterning without polishing. The first basecoat layer may have a height that is 40-80% of the combined height of the first and second layers of basecoat after the planarization step 1230.

In another example implementation, the height of the first basecoat layer is substantially equal to three microns and the height of the second basecoat layer is substantially equal to two and a half microns prior to the planarization step 1230. Therefore, two and a half microns of topography are formed on top of the electrical vias by the basecoat application step 1225. In this case, the planarization step 1230 may remove at least two and a half microns of material from the wafer to expose the upper portion of the electrical recessed vias.

After the planarization step 1230, a contact pad attachment step 1235 attaches a contact pad to the transducer head to be in contact with the upper portion of each of the electrical vias. In one implementation, the contact pad contacts the upper perimeter of the outer casing and the interior prong within the outer casing.

In another implementation, the contact pad is axially aligned with the upper portion and base portion. In yet another implementation, the contact pad is axially aligned with the interior prong and a center of the base portion.

The specific steps discussed with respect to each of the implementations disclosed herein are a matter of choice and may depend on the materials utilized and/or the topography-related requirements of a given system. The steps discussed may be performed in any order, adding and omitting as desired, unless explicitly claimed otherwise or a specific order is inherently necessitated by the claim language.

The above specification, examples, and data provide a complete description of the structure and use of exemplary implementations of the invention. Since many implementations of the invention can be made without departing from the spirit and scope of the invention, the invention resides in the claims hereinafter appended.

What is claimed is:

1. A layered microelectronic structure comprising:
    a basecoat layer on a substrate;
    an electrical via in the basecoat layer that has a base portion and an upper portion, wherein the upper portion has an outer casing and an interior prong, the upper portion has a width that is greater than a width of the base portion, and the electrical via contacts the substrate at an end of the base portion; and
    a contact pad that contacts the upper portion of the electrical via and is axially aligned with the base portion and the upper portion, wherein the contact pad is electrically connected to the substrate by the electrical via.

2. The layered microelectronic structure of claim 1, wherein the base portion of the electrical via is plated into a hole etched in the basecoat layer.

3. The layered microelectronic structure of claim 1, wherein the outer casing is separated from the interior prong by a space filled with material of the basecoat layer.

4. The layered microelectronic structure of claim 1, wherein the interior prong and the outer casing are in contact with the contact pad.

5. The layered microelectronic structure of claim 1, wherein the interior prong is formed separately from the outer casing.

6. The layered microelectronic structure of claim 1, wherein the interior prong is axially aligned with the contact pad and a center of the base portion.

7. An electrical via comprising:
    a base portion in contact with a substrate; and
    an upper portion that has an outer casing and an interior prong and is in contact with the base portion and a contact pad, wherein the upper portion is axially aligned with the base portion and the contact pad, the upper portion has a width that is greater than a width of the base portion, and the contact pad is electrically connected to the substrate by the electrical via.

8. The electrical via of claim 7, wherein the base portion of the electrical via is plated into a hole etched in a basecoat layer.

9. The electrical via of claim 7, wherein the outer casing is separated from the interior prong by a space filled with a basecoat material.

10. The electrical via of claim 7, wherein the interior prong is formed separately from the outer casing.

11. The electrical via of claim 7, wherein the interior prong is in contact with the contact pad.

12. The electrical via of claim 7, wherein the interior prong is axially aligned with the contact pad and a center of the base portion.

13. A method comprising:
    building an electrical via in a basecoat layer that has a base portion and an upper portion, wherein the upper portion has an outer casing and an interior prong, the upper portion has a width that is greater than a width of the base portion, and the electrical via contacts the substrate at an end of the base portion; and
    building a contact pad in contact with the upper portion of the electrical via and axially aligned with the upper portion and the base portion, wherein the contact pad is electrically connected to the substrate by the electrical via.

14. The method of claim 13, wherein building the electrical via further comprises:
    plating the base portion into a hole etched in a basecoat.

15. The method of claim 13, wherein building the electrical via further comprises plating the interior prong on top of the base portion within the outer casing.

16. The method of claim 13, further comprising
    depositing a first basecoat layer on the substrate that is substantially equal in height to the base portion of the electrical via; and
    depositing a second basecoat layer on top of the first basecoat layer.

17. The method of claim 16, wherein a total height of the electrical via is substantially equal to the combined height of the first and second layers of basecoat.

18. The layered microelectronic structure of claim 1, wherein the basecoat layer includes:
    a first basecoat layer on the substrate that is substantially equal in height to the base portion of the electrical via; and
    a second basecoat layer on top of the first basecoat layer.

19. The layered microelectronic structure of claim 18, wherein a total height of the electrical via is substantially equal to the combined height of the first and second layers of basecoat.

20. The electrical via of claim 8, further comprising:
    a first basecoat layer on the substrate that is substantially equal in height to the base portion of the electrical via; and
    a second basecoat layer on top of the first basecoat layer.

* * * * *